United States Patent [19]
Okamoto

[11] Patent Number: 6,005,440
[45] Date of Patent: Dec. 21, 1999

[54] OPERATIONAL AMPLIFIER

[75] Inventor: Seiji Okamoto, Tokyo, Japan

[73] Assignee: Oki Electric Industry Co., Ltd., Tokyo, Japan

[21] Appl. No.: 09/120,846

[22] Filed: Jul. 23, 1998

[30] Foreign Application Priority Data

Nov. 26, 1997 [JP] Japan .................................. 9-324636
May 26, 1998 [JP] Japan .................................. 10-144367

[51] Int. Cl.$^6$ ................................ H03F 3/45; H02H 7/20
[52] U.S. Cl. ......................... 330/253; 330/255; 330/298
[58] Field of Search ..................................... 330/253, 255, 330/292, 298

[56] References Cited

U.S. PATENT DOCUMENTS 4,335,355 6/1982 Haque ..................................... 330/255
5,670,910 9/1997 Kato ....................................... 330/253

FOREIGN PATENT DOCUMENTS 8-274551 10/1996 Japan .

*Primary Examiner*—Robert Pascal
*Assistant Examiner*—Patricia T. Nguyen
*Attorney, Agent, or Firm*—Venable; Robert J. Frank

[57] ABSTRACT

An operational amplifier capable of supplying a large power approximate to a power supply voltage to a load resistance and of rendering the current consumption relative to the power supply voltage small when a signal is not issued. The operational amplifier comprises a first differential amplifying stage, a first amplifying stage, a first level shifting stage, a second differential amplifying stage, a second amplifying stage, a second level shifting stage, and outputting stage, a first phase compensation circuit and a second compensation circuit. The first differential amplifying stage differentially amplifies input signals while n-channel transistors serves as a differential amplifying elements. The second differential amplifying stage differentially amplifies input signals while p-channel transistors serves as a differential amplifying elements. The first amplifying stage amplifies an output of the first differential amplifying stage in opposite phase. The second amplifying stage amplifies an output of the second differential amplifying stage in opposite phase. The outputting stage comprising a p-channel transistor a source of which is connected to a first power supply voltage and an n-channel transistor a source of which is connected to a second power supply voltage for executing complementary operation in response to outputs of the first and second differential amplifying stages. The first level shifting stage level shifts an output of the first amplifying stage in the direction of the first power supply voltage to control a gate of the n-channel transistor of the outputting stage. The second level shifting stage level shifts an output of the second amplifying stage in the direction of the second power supply voltage to control a gate of the p-channel transistor of the outputting stage.

20 Claims, 6 Drawing Sheets

OPERATIONAL AMPLIFIER

BACKGROUND OF THE INVENTION

1. Field of the Invention

The invention relates to an operational amplifier for executing adding and subtracting operations, etc. of analog signals, particularly to an operational amplifier capable of supplying a large power approximate to a power supply voltage to a load resistance and of reducing the current consumption when a signal is not issued.

2. Description of the Related Art

There is a technique in this field, for example, as disclosed in Japanese Patent Laid-Open Publication No. 8-274551. An operational amplifier disclosed in this publication includes a differential amplifying stage, a first level shifting stage, a first amplifying stage, a second amplifying stage, a second level shifting stage and an outputting stage. An input signal is differentially amplified by the differential amplifying stage. The first level shifting stage level shifts an output of the differential amplifying stage in the direction of a second power supply voltage. The first amplifying stage amplifies an output of the first level shifting stage in opposite phase. The second amplifying stage amplifies the output of the differential amplifying stage in opposite phase. The second level shifting stage level shifts an output of the second amplifying stage in the direction of a first power supply voltage. The outputting stage comprises a p-channel MOS transistor (hereinafter referred to as PMOS) and an n-channel MOS transistor (hereinafter referred to as NMOS) for executing complementary operation in response to output signals of the first amplifying stage and the second level shifting stage. The PMOS constituting the outputting stage is driven by an output of the first amplifying stage. The NMOS constituting the outputting stage is driven by an output of the second level shifting stage.

However, there are following problems in the conventional operational amplifier. That is, a driving signal of the PMOS constituting the outputting stage is amplified through the first level shifting stage for level shifting the output of the differential amplifying stage in the direction of the second power supply voltage, the first amplifying stage for amplifying the output of the first level shifting stage in opposite phase, and the second level shifting stage for level shifting the output of the first amplifying stage in the direction of the second power supply voltage. Accordingly, it is difficult to set the dc voltage of the driving signal.

Since the dc voltage of the driving signal determines a current which flows through the outputting stage when a signal is not issued, namely, at the signal non-issuance time, it is necessary that this current is not varied largely owing to the variations of transistor characteristics during fabricating process and the change is power supply voltage. Accordingly, higher gain is not taken place from the differential amplifying stage to the second level shifting stage. As a result, it was necessary to render the ratio (W/L) of the channel width (W) of a transistor of the outputting stage with respect to the channel length (L) thereof large so as to render the channel conductance large in order to permit a large current to flow through the outputting stage. Further, on the grounds set forth above, the change in the power supply current relative to the change in the power supply voltage was large at the signal non-issuance time.

Accordingly, there has been desired so far an operational amplifier capable of supplying a large power approximate to a power supply voltage to a load resistance and of rendering the change in the consumption current relative to the power supply voltage low at the signal non-issuance time.

SUMMARY OF THE INVENTION

An operational amplifier of the invention comprises a first differential amplifying stage for differentially amplifying input signals and comprising n-channel transistors serving as a differential amplifying elements, a second differential amplifying stage for differentially amplifying input signals and comprising p-channel transistors serving as a differential amplifying elements, a first amplifying stage for amplifying an output of the first differential amplifying stage in opposite phase, a second amplifying stage for amplifying an output of the second differential amplifying stage in opposite phase, an outputting stage comprising a p-channel transistor a source of which is connected to a first power supply voltage and an n-channel transistor a source of which is connected to a second power supply voltage for executing complementary operation in response to outputs of the first and second differential amplifying stages, a first level shifting stage for level shifting an output of the first amplifying stage in the direction of the first power supply voltage to control a gate of the n-channel transistor of the outputting stage, and a second level shifting stage for level shifting an output of the second amplifying stage in the direction of the second power supply voltage to control a gate of the p-channel transistor of the outputting stage.

In such an operational amplifier, the input signal is differentially amplified by the first differential amplifying stage. The output of the first differential amplifying stage is amplified by the first amplifying stage in opposite phase. The input signal is differentially amplified by the second differential amplifying stage. The output of the second differential amplifying stage is amplified by the second amplified stage in opposite phase. If the amplification degree of the first and second amplifying stages is large, the output thereof is oscillated to a voltage approximate to the first and second power supply voltages. The output of the first amplifying stage is level shifted by the first level shifting stage in the direction of the first power supply voltage. The output of the second amplifying stage is level shifted by the second level shifting stage in the direction of the second power supply voltage. The levels of outputs of the first and second amplifying stages are shifted to avoid the transistor of the outputting stage from being in an off area when the outputs of the first and second amplifying stages become a voltage approximate to the power supply voltages. Accordingly, it is possible to supply a large power approximate to the power supply voltage to the load resistance so as to render the change in consumption current relative to the power supply voltage small at the signal non-issuance time. Further, symmetrical constructions are formed between the input terminal and the gate of the n-channel transistor of the outputting stage, and between the input terminal and the gate of the p-channel transistor, thereby rendering the distortion of waveforms thereof small.

Further, in the operational amplifier of the invention, respective first and second amplifying stages are preferably constituted by transistors for amplifying purpose (hereinafter referred to as amplifying transistors) and constant current elements. The amplifying transistor of the first differential amplifying stage employ those having substantially the same characteristics as the load transistor of the first differential amplifying stage, and the amplifying transistor of the second differential amplifying stage employ those having substantially the same characteristics as a load transistor of the second differential amplifying stage.

With such a construction, the variations in transistor characteristics during fabricating process can be compensated.

Still further, in the operational amplifier of the invention, the output dc voltages of the first and second amplifying stages are preferably set in the manner that the voltages between the sources and drains of transistors constituting the load elements of the first and second amplifying stages are lower than threshold voltages of the same transistors. With such a construction, the amplification degree of the voltage is made large.

In the operational amplifier of the invention, bias voltages of transistors for realizing respective constant current elements of the first differential amplifying stage, the second differential amplifying stage, the first amplifying stage, the second amplifying stage, the first level shifting stage and the second level shifting stage are produced by a bias circuit for receiving a reference power supply voltage.

Since the bias voltages are produced by a bias circuit using a reference voltage, the change in consumption of the operational amplifier relative to that of the power supply voltage at the signal non-issuance time is made small.

In the operational amplifier of the invention, the transistors for realizing constant current elements have substantially the same transistor characteristics as those for producing bias voltages by the bias circuit. These transistors are preferably connected to each other by mirror connection.

Since it is constructed that the same types of transistors are be connected to one another by mirror connection to supply the bias voltage, the change in consumption current at the non-issuance time caused by the variations in transistor characteristics during fabricating process can be made small.

In the operational amplifier of the invention, it is preferable that the bias circuit produces a first bias voltage for determining a current which flows through the constant current element constituted by the p-channel transistor and a second bias voltage for determining a current which flows through the constant current element constituted by the n-channel transistor. The first and the second bias voltages are determined preferably by the construction of a single p-channel transistor or a single n-channel transistor and a reference power supply voltage.

In the operational amplifier of the invention, a first power-down control transistor is preferably provided between the gate of the p-channel transistor of the outputting stage and the first power supply voltage. A second power-down control transistor is preferably provided between the gate of the n-channel transistor of the outputting stage and the second power supply voltage.

With the provision of the power-down control transistors, the current consumption at the signal non-issuance time can be restrained.

In the operational amplifier of the invention, a first phase compensation circuit is preferably provided between an output terminal of the outputting stage and an output terminal of the second level shifting stage, and also a second phase compensation circuit is preferably provided between an output terminal of the outputting stage and an output terminal of the first level shifting stage.

With the provision of these phase compensation circuits, the oscillating operation of the operational amplifier can be restrained.

In the operational amplifier of the invention, the first amplifying stage comprises a p-channel transistor having a source connected to the first supply voltage and a gate connected to the output terminal of the first differential amplifying stage, and an n-channel transistor having a source connected to the second power supply voltage and a gate connected to a second bias voltage, and a drain connected to a drain of the p-channel transistor, wherein the drain of the p-channel transistor serves as the output terminal.

Further, in the operational amplifier of the invention, the second amplifying stage comprises an n-channel transistor having a source connected to the second power supply voltage and a gate connected to the output terminal of the second differential amplifying stage, and a p-channel transistor having a source connected to the first power supply voltage and a gate connected to a first bias voltage, and a drain connected to a drain of the n-channel transistor, wherein the drain of the n-channel transistor serves as the output terminal.

In the operational amplifier of the invention, the first level shifting stage comprises a p-channel transistor having a source connected to the first power supply voltage and a gate connected to a first bias voltage, and an n-channel transistor having a source connected to the output terminal of the first amplifying stage, a gate and a drain which are commonly connected to each other to form a common node connected to a drain of the p-channel transistor, wherein the common node of the gate and drain serves as an output terminal.

In the operational amplifier of the invention, the second level shifting stage comprises an n-channel transistor having a source connected to the second power supply voltage and a gate connected to a second bias voltage, and a p-channel transistor having a source connected to the output terminal of the second amplifying stage, a gate and a drain which are commonly connected to each other to form a common node connected to a drain of the n-channel transistor, wherein the common node of the gate and drain serves as the output terminal.

In the operational amplifier of the invention, the first phase compensation circuit comprises an MOS resistor composed of a p-channel transistor and an n-channel transistor, and a capacitor which are respectively provided between the second level shifting stage and the output terminal of the outputting stage and serially connected to one another in this order, wherein the gate of the p-channel transistor is connected to the second power supply voltage and the gate of the n-channel transistor is connected to the first power supply voltage.

In the operational amplifier of the invention, the second phase compensation circuit comprises an MOS resistor composed of a p-channel transistor and an n-channel transistor, and a capacitor which are respectively provided between the first level shifting stage and the output terminal of the outputting stage and serially connected to one another in this order, wherein the gate of the p-channel transistor is connected to the second power supply voltage and the gate of the n-channel transistor is connected to the first power supply voltage.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

An operational amplifier according to preferred embodiments of the invention will be now described with reference to the attached drawings. The attached drawings schematically illustrate the construction, layout relation, and connection relation between the components to such an extent that a person skilled in the art can understand them. Conditions such as numerals set forth hereunder serve as mere examples. Accordingly, the operational amplifier is not limited to the preferred embodiments set forth hereinafter.

First Embodiment [FIGS. 1 to 4]

Figure 1:
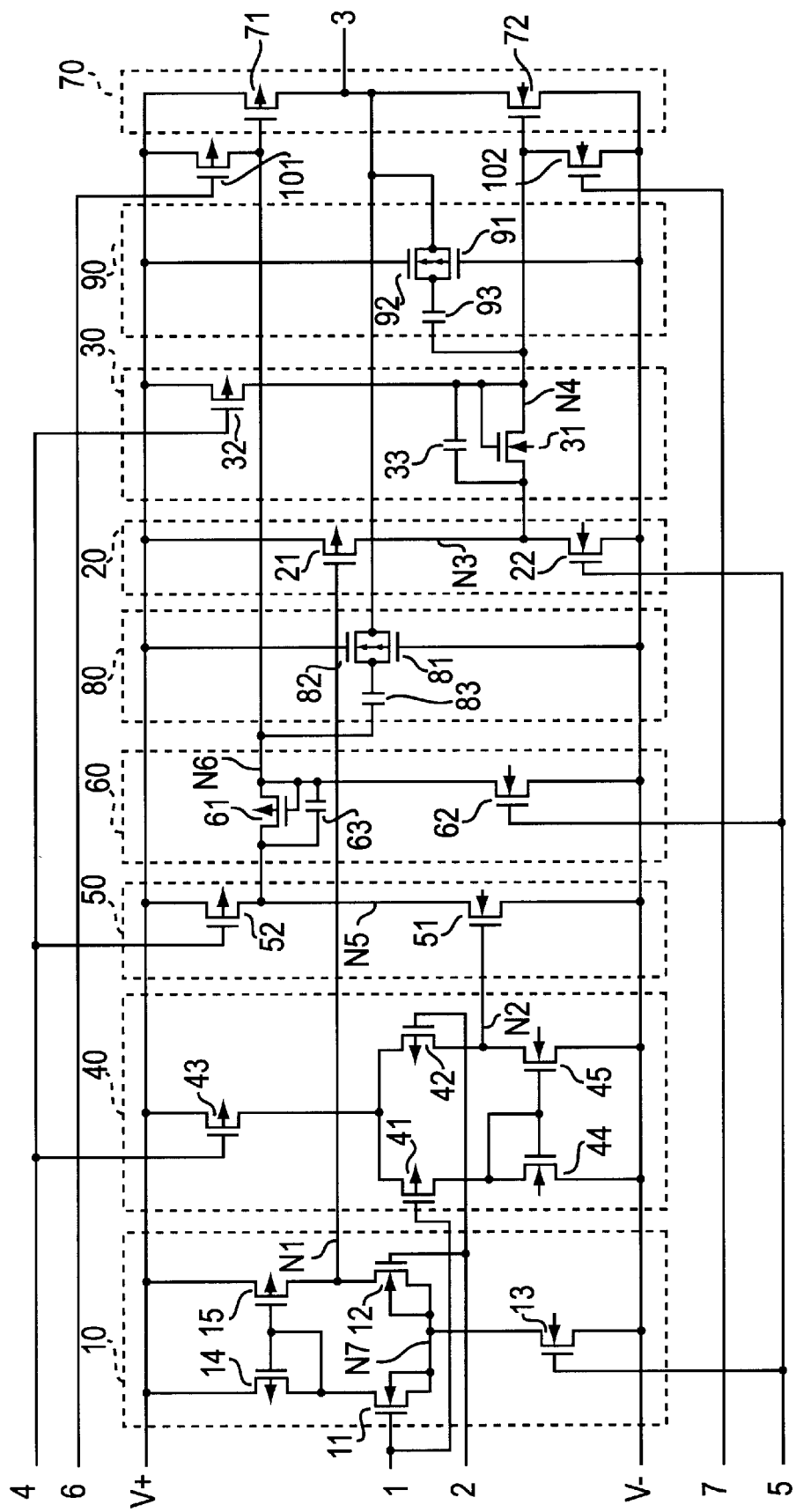
FIG. 1 is a view showing an operational amplifier according to a first embodiment of the invention.

The operational amplifier according to a first embodiment will be now described with reference to FIGS. 1 to 4. FIG. 1 is a circuit diagram showing the construction of the operational amplifier. The operational amplifier comprises a first differential amplifying stage 10, a first amplifying stage 20, a first level shifting stage 30, a second differential amplifying stage 40, a second amplifying stage 50, a second level shifting stage 60, an outputting stage 70, a first phase compensation circuit 80 and a second phase compensation circuit 90.

The operational amplifier further comprises a first power supply terminal V+, a second power supply terminal V−, a first input terminal 1, a second input terminal 2, an output terminal 3, a first bias voltage input terminal 4, a second bias voltage input terminal 5, a first power down control signal input terminal 6, and a second power down control signal input terminal 7. In the first embodiment, the voltage of the first power supply terminal V+ (hereinafter sometimes referred to as first power supply voltage V+) is higher than that of the second power supply terminal V− (hereinafter sometimes referred to as second power supply voltage V−). Further, a first bias voltage Vb1 is applied to the second differential amplifying stage 40. A second bias voltage Vb2 is applied to the second bias voltage input terminal 5.

The first differential amplifying stage 10 comprises n-channel MOS transistors (hereinafter referred to as NMOSs) serving as differential amplifying elements for differentially amplifying input signals. That is, the first differential amplifying stage 10 differentially amplifies the input signals in response to input potential between the first input terminal 1 and the second input terminal 2, and outputs it to a node N1. The first differential amplifying stage 10 comprises NMOSs 11 and 12 for inputting purpose (hereinafter referred to as inputting NMOSs 11 and 12), and an NMOS 13 for constant current supply, and PMOSs 14 and 15 for loading purpose (hereinafter referred to as loading PMOSs 14 and 15). Respective gates of the NMOSs 11 and 12 are connected to the first input terminal 1 and the second input terminal 2. Respective sources and drains of the NMOSs 11 and 12 are commonly connected to a drain of the NMOS 13. A gate of the NMOS 13 is connected to the second bias voltage input terminal 5 and a source thereof is connected to the second power supply terminal V−. Respective gates of the PMOSs 14 and 15 are connected to a drain of the PMOS 14 and the drain of the NMOS 11. A drain of the PMOS 15 is connected to the drain of the NMOS 12 and to the node N1.

The first amplifying stage 20 amplifies an output of the first differential amplifying stage 10, i.e., the voltage at the node N1 in opposite phase and comprises a PMOS 21 and an NMOS 22. A gate of the PMOS 21 is connected to the node N1. A drain of the PMOS 21 is connected to a node N3 and a drain of the NMOS 22, and a source thereof is connected to the first power supply terminal V+. A gate of the NMOS 22 is connected to the second bias voltage input terminal 5 and a source thereof is connected to the second power supply terminal V−. The amplifying PMOS 21 of the first amplifying stage 20 has substantially the same characteristics of the loading PMOSs 14 and 15 of the first differential amplifying stage 10.

The first level shifting stage 30 level shifts an output of the first amplifying stage 20, i.e., the voltage at the node N3 in the direction of the first power supply terminal V+, and outputs it to a node N4, and it comprises an NMOS 31 and a PMOS 32 which are subjected to an MOS diode connection and a capacitor 33. A source of the NMOS 31 is connected to the node N3 and a gate and a drain thereof are connected to the node N4 and a drain of the PMOS 32. A gate of the PMOS 32 is connected to the first bias voltage input terminal 4, and a source thereof is connected to the first power supply terminal V+ to serve as a constant current supply. The capacitor 33 is connected between the source and the drain of the NMOS 31.

The second differential amplifying stage 40 differentially amplifies input signals while PMOSs serve as differential amplifying elements, namely, it differentially amplifies the input signals in response to the input potential between the first input terminal 1 and the second input terminal 2, and outputs it to a node N2. The second differential amplifying stage 40 comprises inputting PMOSs 41 and 42, a PMOS 43 for constant current supply, and loading NMOSs 44 and 45. Respective gates of the PMOSs 41 and 42 are respectively connected to the first input terminal 1 and the second input terminal 2. Respective sources of the PMOSs 41 and 42 are commonly connected to a drain of the PMOS 43. A gate of the PMOS 43 is connected to the first bias voltage input terminal 4 and a source thereof is connected to the first power supply terminal V+. Respective gates of the NMOSs 44 and 45 are connected to a drain of the NMOS 44 and a drain of the PMOS 41. A drain of the NMOS 45 is connected to a drain of the PMOS 42 and the node N2.

The second amplifying stage 50 amplifies an output of the second differential amplifying stage 40, i.e., the voltage at the node N2 is opposite phase and comprises an NMOS 51 and a PMOS 52. A gate of the NMOS 51 is connected to the node N2. A drain of the NMOS 51 is connected to a node N5 and a drain of the PMOS 52, and a source thereof is connected to the second power supply terminal V−. A gate of the PMOS 52 is connected to the first bias voltage input terminal 4 and a source thereof is connected to the first power supply terminal V+. The amplifying NMOS 51 of the second amplifying stage 50 has substantially the same characteristics of the loading NMOSs 44 and 45 of the second differential amplifying stage 40.

The second level shifting stage 60 level shifts an output of the second amplifying stage 50, i.e., the voltage at the node N5 in the direction of the second power supply terminal V− and outputs it to a node N6, and it comprises a PMOS 61 and an NMOS 62 which are subjected to an MOS diode connection and a capacitor 63. A source of the PMOS 61 is connected to the node N5, and a gate and a drain thereof are connected to the node N6 and a drain of the NMOS 62. A gate of the NMOS 62 is connected to the second bias voltage input terminal 5 and a source thereof is connected to the second power supply terminal V− to serve as a constant current supply. The capacitor 63 is connected between the source and the drain of the PMOS 61.

The outputting stage 70 includes a PMOS 71 having a source connected to the first power supply terminal V+ and an NMOS 72 having a source connected to the second power supply terminal V−, and it executes complimentary operation in response to outputs of the first differential amplifying stage 10 and the second differential amplifying stage 40. The outputting stage 70 outputs an output voltage which is driven by the voltages at the node N4 and the node N6 to the output terminal 3. A source of the PMOS 71 is connected to the first power supply terminal V+, and a gate thereof is connected to the node N6, and a drain thereof is connected to the output terminal 3 and a drain of the NMOS 72. Accordingly, a gate of the PMOS 71 is controlled by a voltage at the node N6. A gate of the NMOS 72 is connected to the node N4 and a source thereof is connected to the second power supply terminal V−. Accordingly, the gate of the NMOS 72 is controlled by the voltage at the node N6.

Further, the first phase compensation circuit 80 is provided between the output terminal 3 of the outputting stage 70 and the node N6 serving as the output terminal of the second level shifting stage 60, and the second phase compensation circuit 90 is provided between the output terminal 3 of the outputting stage 70 and the node N4 serving as the output terminal of the first level shifting stage 30.

The first phase compensation circuit 80 comprises a PMOS 81, an NMOS 82 and a capacitor 83. Respective sources and drains of the PMOS 81 and NMOS 82 are connected to each other for forming an MOS resistor. A gate of the PMOS 81 is connected to the second powersupply-terminal V−. A gate of the NMOS 82 is connected to the first power supply terminal V+. The MOS resistor and the capacitor 83 are serially connected to each other, and also connected between the node N6 and the output terminal 3.

The second phase compensation circuit 90 comprises a PMOS 91, an NMOS 92 and a capacitor 93. Respective sources and drains of the PMOS 91 and NMOS 92 are connected to each other for forming an MOS resistor. A gate of the PMOS 91 is connected to the second power supply terminal V−. A gate of the NMOS 92 is connected to the first power supply terminal V+. The MOS resistor and the capacitor 93 are serially connected to each other, and also connected between the node N4 and the output terminal 3.

A PMOS 101 serving as a first power down control transistor is provided between the gate of the PMOS 71 of the outputting stage 70 and the first power supply terminal V+. An NMOS 102 serving as a second power down control transistor is provided between the gate of the NMOS 72 of the outputting stage 70 and the second power supply terminal V−. A gate of the PMOS 101 is connected to the first power down control signal input terminal 6, and a drain thereof is connected to the node N6. A gate of the NMOS 102 is connected to the second power down control signal input terminal 7, a source thereof is connected to the second power supply terminal V−, and a drain thereof is connected to the node N4.

In the operational amplifier according to the first embodiment, bias voltages of the transistors (namely, the NMOSs 13, 22 and 62, and the PMOSs 43, 52 and 32) for realizing respective constant current elements of the first differential amplifying stage 10, the second differential amplifying stage 40, the first amplifying stage 20, the second amplifying stage 50, the first level shifting stage 30, and the second level shifting stage 60 are produced by a bias circuit for receiving a reference power supply voltage.

Figure 2:
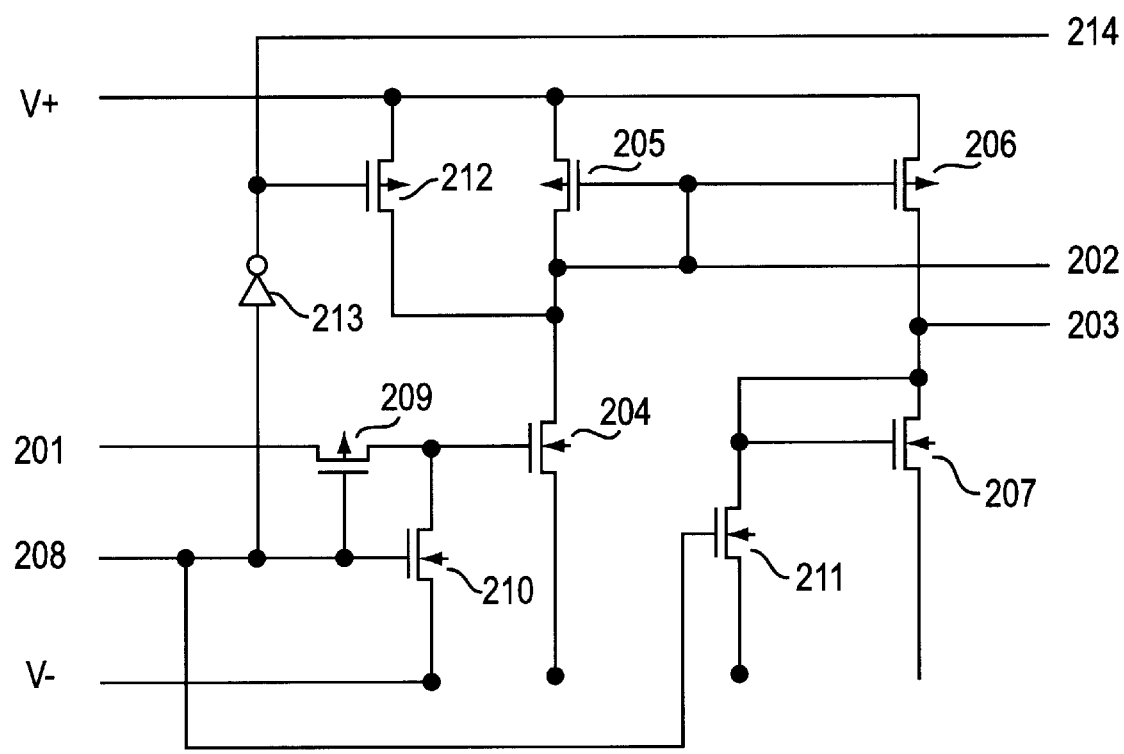
FIG. 2 is a view showing a first bias circuit.

FIG. 2 is a circuit diagram showing a first bias circuit employed by the operational amplifier of the first embodiment. The bias circuit produces the first bias voltage Vb1 for determining the current flowing through the constant current elements constituted by the PMOS (namely, PMOSs 43, 52 and 32) and the second bias voltage Vb2 for determining the current flowing through the constant current elements constituted by the NMOS (NMOSs 13, 22 and 62). These first bias voltage Vb1 and second bias voltage Vb2 are determined by a single PMOS or a single NMOS and the reference power supply voltage.

The bias circuit includes a reference voltage input terminal 201, a first bias voltage output terminal 202, a second bias voltage output terminal 203, a power down control signal. input terminal 208, a power down inverting signal output terminal 214, the first power supply terminal V+ and the second power supply terminal V−. The bias circuit comprises PMOSs 205, 206, 209 and 212, and NMOSs 204, 207, 210 and 211, and an inverter 213.

A source of the PMOS 209 is connected to the reference voltage input terminal 201, a gate thereof is connected to the power down control signal input terminal 208 and a drain thereof is commonly connected to a drain of the NMOS 210 and a gate of the PMOS 204. A gate of the NMOS 210 is connected to the power down control signal input terminal 208. A drain of the PMOS 204 is connected to a gate and a drain of the PMOS 205, a drain of the PMOS 212, a gate of the NMOS 206, and the first bias voltage output terminal 202. A drain of the NMOS 206 is connected to a drain and a gate of the NMOS 207, a drain of the NMOS 211 and the second bias voltage output terminal 203. A gate of the PMOS 212 is connected to the power down control signal input terminal 208. An input of the inverter 213 is connected to the power down control signal input terminal 208, and an output thereof is connected to a gate of the PMOS 212 and the power down inverting signal output terminal 214. Respective sources of the NMOSs 204, 207, 210 and 211 are connected to the second power supply terminal V−, and respective sources of the PMOSs 205, 206 and 212 are connected to the first power supply terminal V+.

In the connection between the operational amplifier and the bias circuit, the first bias voltage output terminal 202 is connected to the first bias voltage input terminal 4, and the second bias voltage output terminal 203 is connected to the second bias voltage input terminal 5, while the power down inverting signal output terminal 214 is connected to the first power down control signal input terminal 6 and the power down control signal input terminal 208 is connected to the second power down control signal input terminal 7.

The bias circuit as set forth hereinbefore is employed when the second power supply terminal V− serves as the reference voltage. When the first power supply terminal V+ serves as the reference voltage, the following bias circuit is employed.

Figure 3:
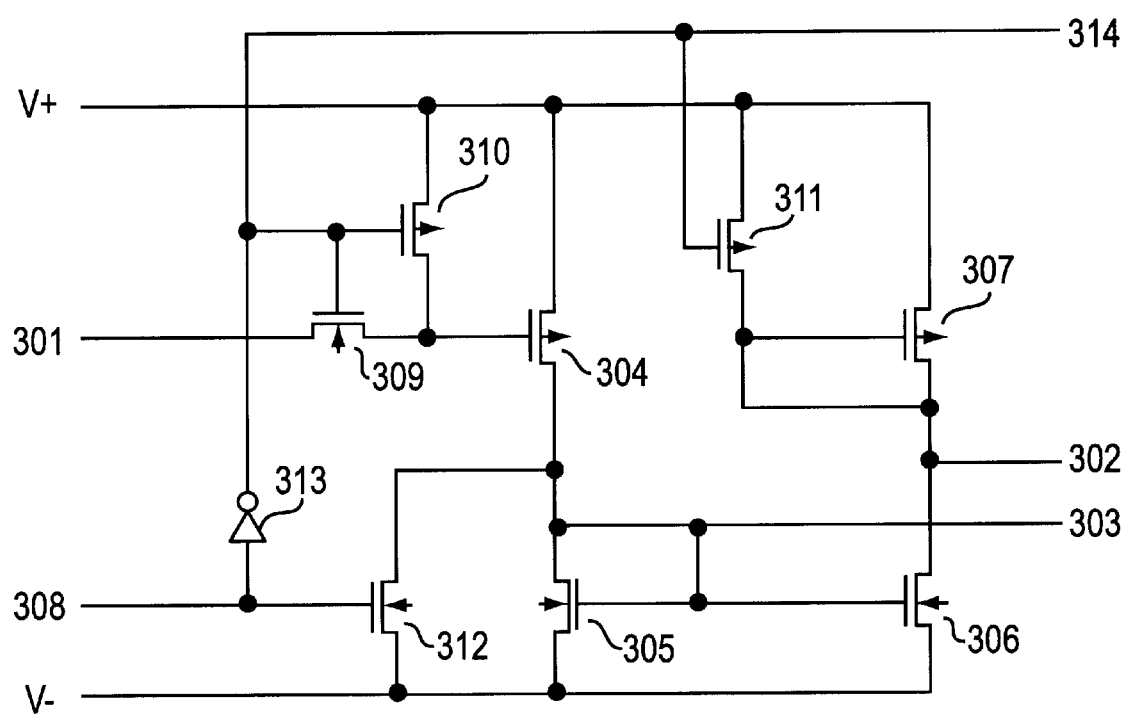
FIG. 3 is a view showing a second bias circuit.

FIG. 3 is a circuit diagram showing a second bias circuit. The bias circuit comprises a reference voltage input terminal 301, a first bias voltage output terminal 302, a second bias voltage output terminal 303, a power down control signal input terminal 308, a power down inverting signal output terminal 314, the first power supply terminal V+ and the second power supply terminal V−. The bias circuit comprises NMOSs 305, 306, 309 and 312, and PMOSs 304, 307, 310 and 311, and an inverter 313.

A source of the NMOS 309 is connected to the reference voltage input terminal 301, a gate thereof is connected to the power down inverting signal output terminal 314 and a drain thereof is connected to a drain of the PMOS 310 and a gate of the NMOS 304. A gate of the PMOS 310 is connected to the power down inverting signal output terminal 314. A drain of the PMOS 304 is connected to a gate and a drain of the NMOS 305, a drain of the NMOS 312, a gate of the NMOS 306, and the second bias voltage output terminal 303. A drain of the NMOS 306 is connected to a drain and a gate of the PMOS 307, a drain of the PMOS 311 and the first bias voltage output terminal 302. A gate of the PMOS 311 is connected to the power down inverting signal output terminal 314. An output of the inverter 313 is connected to the power down inverting signal output terminal 314, and an input thereof is connected to a gate of the NMOS 312 and the power down control signal input terminal 308. Respective sources of the PMOSs 304, 307, 310 and 311 are connected to the first power supply terminal V+, and respective sources of the NMOSs 305, 306 and 312 are connected to the second power supply terminal V−.

In the connection between the operational amplifier and the bias circuit, the first bias voltage output terminal 302 is connected to the first bias voltage input terminal 4, the second bias voltage output terminal 303 is connected to the second bias voltage input terminal 5, the power down inverting signal output terminal 314 is connected to the first power down control signal input terminal 6 and the power down control signal input terminal 308 is connected to the second power down control signal input terminal 7.

Figure 4:
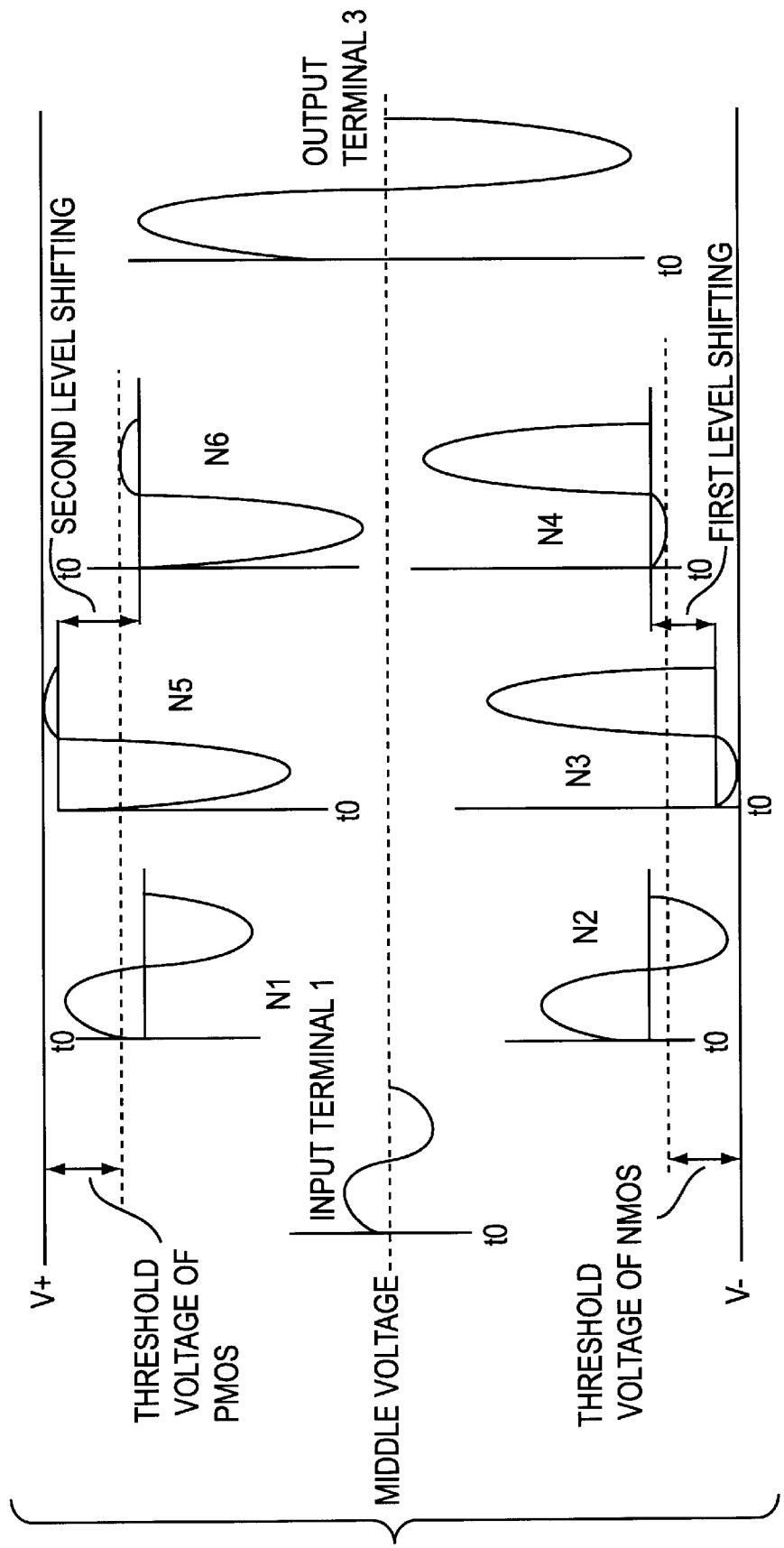
FIG. 4 is a view for explaining the operation of the operational amplifier.

The operation of the operational amplifier according to the first embodiment will be now described with reference to FIG. 4. FIG. 4 shows graphs for explaining the operations of the operational amplifier. Each graph in FIG. 4 represents time in the axis of abscissas and voltage in the axis of ordinates. The time when the signals are inputted to the first and second input terminals 1 and 2 is referred to as reference time t0.

The signals inputted to the first and second input terminals 1 and 2 are differentially amplified by the first differential amplifying stage 10, and outputted to the node N1. The output signal is in phase with the phase of the first input terminal 1 (node N1 in FIG. 4). A dc voltage component of the output signal is set in the manner that a voltage between the first power supply terminal V+ and the node N1 has a value slightly larger than threshold voltages of the PMOSs 14 and 15.

Subsequently, the input signal at the node N1 is inverted and amplified by the first amplifying stage 20, and outputted to the node N3. The dc voltage at the node N3 is set in the manner that the voltage between the drain and source of the NMOS 22 has a value sufficiently smaller than the threshold voltage of the NMOS 22 (node N3 in FIG. 4).

Next, the signal inputted to the node N3 is level shifted by the first level shifting stage 30 and outputted to the node N4. The output signal is in phase with the input signal, and the dc voltage is shifted by the threshold voltage of the NMOS 31 in the direction of the first power supply terminal V+ (node N4 in FIG. 4).

The signals inputted to the first and second input terminals 1 and 2 are inputted to the first differential amplifying stage 10 and also to the second differential amplifying stage 40.

The signals inputted to the first and second input terminals 1 and 2 are differentially amplified by the second differential amplifying stage 40 and outputted to the node N2. The output signal is in phase with the phase of a signal at the first input terminal 1 (node N2 in FIG. 4). The dc voltage component of the output signal is set in the manner that a voltage between the second power supply terminal V− and the node N2 has a value slightly larger than the threshold voltages of the NMOSs 44 and 45.

Thereafter, the input signal at the node N2 is inverted and amplified by the second amplifying stage 50, and outputted to the node N5. The dc voltage at the node N5 is set in the manner that the voltage between the drain and source of the PMOS 52 has a value sufficiently smaller than the threshold voltage of the PMOS 52 (node N5 in FIG. 4).

The signal inputted to the node N5 is level shifted by the second level shifting stage 60 and is outputted to the node N6. The output signal is in phase with the input signal, and the dc voltage is shifted by the threshold voltage of the PMOS 61 in the direction of the second power supply terminal V− (node N6 in FIG. 4).

The outputting stage 70 receives the signals at the node N4 and the node N6, and outputs them to the output terminal 3. The signals at the node N4 and the node N6 have a complementary relation with respect to the signals inputted to the first input terminal 1 and the second input terminal 2. If the signal at the first input terminal 1 is inputted in a positive direction (in the direction of the voltage at the first power supply terminal V+), a signal which is amplified in a negative direction (in the direction of the voltage at the second power supply terminal V−) is outputted from the node N6. Although at this time, the signal is outputted similarly in the negative direction from the node N4, the voltage at the node N4 is clipped by the threshold voltage of the NMOS 31 since the NMOS 31 is subjected to a diode connection (node N4 in FIG. 4).

Likewise, if the signal is inputted in the negative direction, the signal amplified in the positive direction is outputted from the node N4. At this time, although the signal is outputted similarly in the positive direction from the node N6, the voltage at the node N6 is clipped by the threshold voltage of the PMOS 61 since the PMOS 61 is subjected to the diode connection (node N6 in FIG. 4).

In such a manner, if the positively directed signal is inputted to the first input terminal 1, the negatively directed signal is outputted from the node N6 so that the voltage between the gate and the source of the PMOS 71 of the outputting stage 70 becomes large, and hence the large current can be supplied to the load output through the PMOS 71. At this time, the voltage between the gate and source of the NMOS 72 of the outputting stage 70 is equivalent to the threshold voltage of the NMOS 72, the current scarcely flows through the NMOS 72.

Likewise, if the negatively directed signal is inputted to the first input terminal 1, the positively directed signal is outputted from the node N4 so that the voltage between the gate and the source of the NMOS 72 of the outputting stage 70 becomes large, and the large current can be drawn from the load output side through the NMOS 72. At this time, the voltage between the gate and the source of the PMOS 71 of the outputting stage 70 is equivalent to the threshold voltage of the PMOS 71 so that the current scarcely flows through the PMOS 71.

The oscillating operation of the operational amplifier is restrained by the first phase compensation circuit 80 and the second phase compensation circuit 90.

The PMOS 101 and the NMOS 102 are provided for realizing the power down function, and they are interlocked with the power down operation of the bias circuits shown in FIGS. 2 and 3, thereby rendering the consumption current of the operational amplifier zero when the operational amplifier does not operate.

Next, the operation of the bias circuit is described. In the bias circuit shown in FIG. 2, if the voltage which is equivalent to the second power supply terminal V− is inputted to the power down control signal input terminal 208, the source and drain of the PMOS 209 are rendered conductive and the PMOS 212, and the NMOSs 210, 211 are rendered non-conductive. Accordingly, the voltage inputted to the reference voltage input terminal 201 and the current corresponding to the conductance of the PMOS 204 flow through the PMOS 204, and a current having the same current value also flows through the PMOS 205. The voltage at the first bias voltage output terminal 202 has a value which is determined by this current and the conductance of the PMOS 205. Since the PMOS 206 is connected to the PMOS 205 by mirror connection, the current which flows through the NMOS 206 has a value which is determined by the ratio of the current of the PMOS 205 with respect to the conductance of the PMOSs 205 and 206. Since the current which flows through the NMOS 207 is the same as that which flows through the NMOS 206, the voltage at the second bias voltage output terminal 203 has a value which is determined by this current and the conductance of the NMOS 207. This means that the current which flows through the PMOS 205 and the current which flows through the NMOS 207 have no independence on the power supply voltage but have independence merely on the reference voltage value and conductance of the transistor.

In the bias circuit of FIG. 3, a voltage which is equivalent to the second power supply terminal V− is inputted to the power down control signal input terminal 308, the source and the drain of the NMOS 309 are rendered conductive and the NMOS 312 and the PMOSs 310 and 311 are rendered non-conductive. Accordingly, a current corresponding to the voltage inputted to the reference voltage input terminal 301 and conductance of PMOS 304 flows through he PMOS 304, and the current having the same value as this current flows through the NMOS 305. The voltage at the second bias voltage output terminal 303 has a value which is determined by this current and the conductance of the NMOS 305. The NMOS 306 is connected with the NMOS 305 by mirror connection, the current which flows through the NMOS 306 has a value which is determined by the ratio of the current of the NMOS 305 with respect to the conductance of the NMOS 305 and 306. Since the current which flows through the PMOS 307 is the same as that which flows through the NMOS 306, the voltage at the first bias voltage output terminal 302 has a value which is determined by this current and the conductance of the PMOS 307. This means that the current which flows through the NMOS 305 and the current which flows through the PMOS 307 have no independence on the power supply voltage but have independence merely on the reference voltage value and conductance of the transistor.

In the operational amplifier in FIG. 1 using the thus produced first bias voltage and the second bias voltage, since the PMOSs 32, 43 and 52 have mirror connection relation with respect to the PMOS 205 or PMOS 307, the current which flows through PMOSs 32, 43 and 52 have no independence on the power supply voltage. Likewise, since the NMOSs 13, 22 and 62 have mirror connection relation with respect to the NMOS 207 or NMOS 305, the current which flows through the NMOSs 13, 22 and 62 have no independence on the power supply voltage. Further, respective MOS transistors having mirror connection relation therebetween are the same types of MOS transistors, the degree of dependence of the change in current with respect to variations in the MOS transistor characteristics during fabricating process can be made small.

As a result, it is expected that the operational amplifier according to the first embodiment has the following effects.

1) Since the second differential amplifying stage 40 is provided between the second amplifying stage 50 for driving the PMOS 71 of the outputting stage 70 and the first and second input terminals 1 and 2, it is possible to reduce the number of the level shifting circuits.

2) The loading PMOSs 14 and 15 of the first differential amplifying stage 10 are constructed by the PMOS which is the same as the driving PMOS 21 of the first amplifying stage 20, variations in the transistor characteristics during fabricating process can be compensated. Since the NMOSs 44 and 45 of the second differential amplifying stage 40 are constructed by the NMOS which is the same as the driving NMOS 51 of the second amplifying stage 50, variations in the transistor characteristics during fabricating process can be compensated.

3) The amplifying stage and the level shifting stage between the first and second input terminals 1 and 2 and the gate of the NMOS 72 of the outputting stage 70 and those between the first and second input terminals 1 and 2 and the gate of the PMOS 71 of the outputting stage 70 are symmetric with respect to each other, thereby rendering the distortion of waveforms thereof small.

4) Since the bias voltage is produced by a bias circuit using the reference voltage, the change in consumption current of the operational amplifier relative to the power supply voltage at the signal non-issuance time can be made small.

5) Since the application of the bias voltage is carried out by the mirror connection of the same types of MOS transistors, the change in consumption current at the non-issuance time caused by the variations in transistor characteristics during fabricating process can be made small.

When the consumption current caused by the variations in transistor characteristics during fabricating process, namely, the change in dc voltage (offset) occurs in the operational amplifier when a feedthrough current flowing between the power supply terminals is produced. If the offset exceeding allowable value occurs, the current flows owing to the offset deflecting direction even if the both transistors of the PMOS transistor and NMOS transistor are in no loading condition. As a result, a large feedthrough current flows between the power supply terminals.

Figure 5:
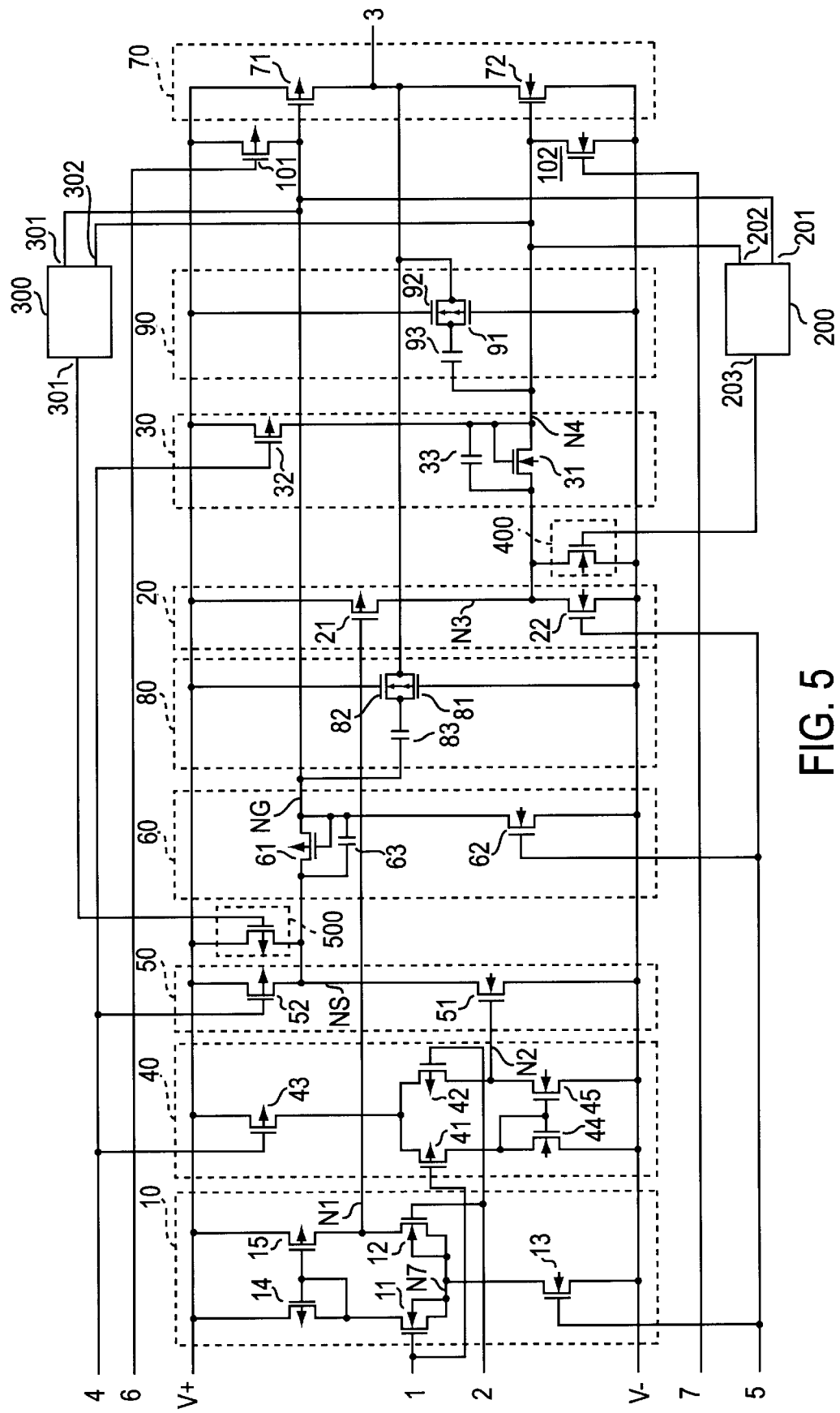
FIG. 5 is a view showing an operational amplifier according to a second embodiment of the invention.
Figure 7:
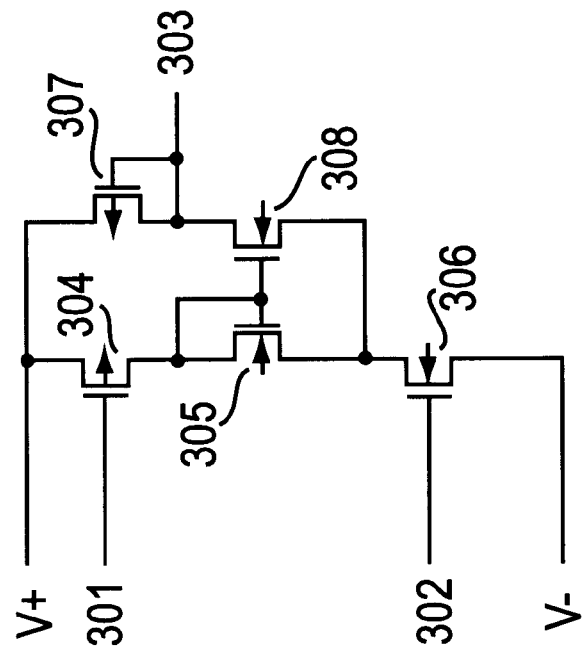
FIG. 7 is a view showing a second overcurrent detecting circuit.
Figure 6:
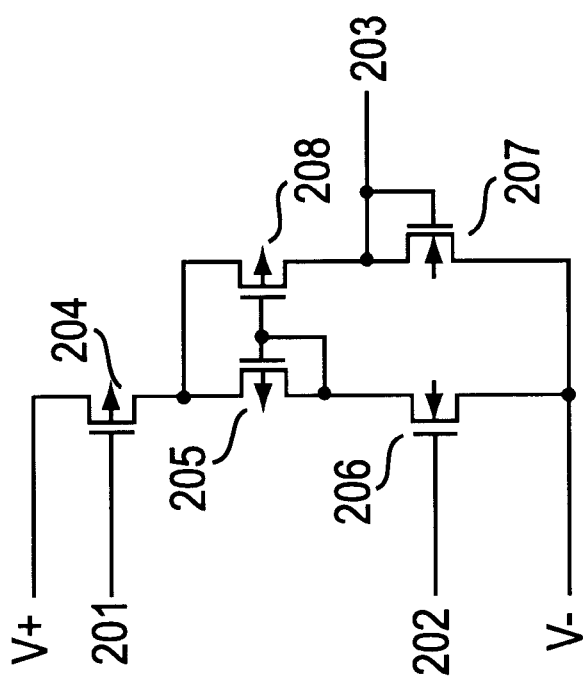
FIG. 6 is a view showing a first overcurrent detecting circuit.

Second Embodiment (FIGS. 5 to 7)

The operational amplifier according to a second embodiment will be now described with reference to FIGS. 5 to 7.

According to the second embodiment, the feedthrough current caused by the offset set forth above can be restrained. In the second embodiment, the components which are same as the aforementioned embodiment are denoted by the same reference numerals.

The operational amplifier comprises a first input terminal 1, a second input terminal 2, an output terminal 3, a first bias voltage input terminal 4, a second bias voltage input terminal 5, a first power down control signal input terminal 6, a second power down control signal input terminal 7, a first differential amplifying stage 10, a first amplifying stage 20, a first level shifting stage 30, a second differential amplifying stage 40, a second amplifying stage 50, a second level shifting stage 60, an outputting stage 70, a first phase compensation circuit 80, a second phase compensation circuit 90, a first overcurrent detecting circuit 200, a second overcurrent detecting circuit 300, a first current compensation transistor 400, and a second current compensation transistor 500. In the second embodiment, the voltage of a first power supply terminal V+ is higher than that of a second power supply terminal V−.

In the first differential amplifying stage 10, an n-channel MOS transistor (hereinafter referred to as NMOS) 11 has a gate connected to the first input terminal 1, a source connected to a drain of an NMOS 13, and a drain connected to a drain of a p-channel MOS transistor (hereinafter referred to as PMOS) 14. An NMOS 12 has a gate connected to the second input terminal 2, a source connected to a drain of the NMOS 13, and a drain connected to a drain of a PMOS 15. The PMOS 14 has a gate connected to a drain of the PMOS 14 and a gate of the PMOS 15, while sources of the PMOSs 14 and 15 are connected to the first power supply terminal V+. The NMOS 13 has a gate connected to the second bias voltage input terminal 5, and a source connected to a second power supply terminal V−. An output of the first differential amplifying stage 10 is connected to a node N1.

In the first amplifying stage 20, a PMOS 21 has a gate connected to the node N1, a source connected to the first power supply terminal V+, and a drain connected, to a drain of an NMOS 22. The NMOS 22 has a gate connected to the second bias voltage input terminal 5, and a source connected to the second power supply terminal V−. An output of the first amplifying stage 20 is connected to a node N3.

In the first level shifting stage 30, an NMOS 31 has a source connected to the node N3, a gate and a drain commonly connected to a drain of a PMOS 32. The PMOS 32 has a gate connected to the first bias voltage input terminal 4 and a source connected to the first power supply terminal V+. A capacitor 33 is connected between the drain and the source of the NMOS 31. An output of the first level shifting stage 30 is connected to a node N4.

In the second differential amplifying stage 40, a PMOS 41 has a gate connected to the first input terminal 1, a source connected to a drain of a PMOS 43, and a drain connected to a drain of an NMOS 44. A PMOS 42 has a gate connected to the second input terminal 2, a source connected to the drain of the PMOS 43, and a drain connected to a drain of an NMOS 45. The NMOS 44 has a gate connected to the drain of the NMOS 44 and a gate of the NMOS 45, and sources of the NMOSs 44 and 45 are connected to the second power supply terminal V−. The PMOS 43 has a gate connected to the first bias voltage input terminal 4 and a source connected to the first power supply terminal V+. An output of the second differential amplifying stage 40 is connected to a node N2.

In the second amplifying stage 50, an NMOS 51 has a gate connected to the node N2, a source connected to the second power supply terminal V−, and a drain connected to a drain of a PMOS 52. The PMOS 52 has a gate connected to the first bias voltage input terminal 4, and a source connected to the first power supply terminal V+. An output of the second amplifying stage 50 is connected to a node N5.

In the second level shifting stage 60, a PMOS 61 has a source connected to the node N5, a gate and a drain commonly connected to a drain of an NMOS 62. The NMOS 62 has a gate connected to the second bias voltage input terminal 5, and a source connected to the second power supply terminal V−. A capacitor 63 is connected between the drain and the source of the PMOS 61. An output of the second level shifting stage 60 is connected to a node N6.

In the outputting stage 70, a PMOS 71 has a gate connected to the node N6, a source connected to the first power supply terminal V+, and a drain connected to a drain of an NMOS 72 and the output terminal 3. The NMOS 72 has a gate connected to the node N4, and a source connected to the second power supply terminal V−.

The first phase compensation circuit 80 is disposed between the node N6 and the output terminal 3. Sources and drains of a PMOS 81 and an NMOS 82 are connected to each other, and a gate of the PMOS 81 is connected to the second power supply terminal V−, and a gate of the NMOS 82 is connected to the first power supply terminal V+. The first phase compensation circuit 80 is a circuit comprising an MOS resistor and a capacitor 83 which are serially connected to each other.

The second phase compensation circuit 90 is disposed between the node N4 and the output terminal 3. Sources and drains of a PMOS 91 and an NMOS 92 are connected to each other, and a gate of the PMOS 91 is connected to the second power supply terminal V−. A gate of the NMOS 92 is connected to the first power supply terminal V+. The second phase compensation circuit 90 is a circuit comprising an MOS resistor and a capacitor 93 which are serially connected to each other.

A PMOS 101 and an NMOS 102 are provided for executing power down control. The PMOS 101 has a gate connected to the first power down control signal input terminal 6, a source connected to the first power supply terminal V+, and a drain connected to the node N6. The NMOS 102 has a gate connected to the second power down control signal input terminal 7, a source connected to the second power supply terminal V−, and a drain connected to the node N4.

The first overcurrent detecting circuit 200 has a first input terminal 201 connected to the node N6, a second input terminal 202 connected to the node N4, and an output terminal connected to a gate of the first current compensation transistor 400.

The second overcurrent detecting circuit 300 has a first input terminal 301 connected to the node N6, a second input terminal 302 connected to the node N4 and an output terminal connected to a gate of the second current compensation transistor 500.

The first current compensation transistor has a gate connected to an output terminal 203 of the first overcurrent detecting circuit 200, a drain connected to the node N3, and a source connected to the second power supply terminal.

The second current compensation transistor has a gate connected to an output terminal 303 of the second overcurrent detecting circuit 300, a drain connected to the node N5, and a source connected to the first power supply terminal.

FIG. 6 shows a concrete circuit diagram of the first overcurrent detecting circuit.

In the circuit, an NMOS 206 has a gate connected to the second input terminal 202, and a drain commonly connected to a drain and a gate of a PMOS 205, and a gate of a PMOS 208. A source of the PMOS 205 is connected to a drain of a PMOS 204 and a source of the PMOS 208. A gate of the PMOS 204 is connected to the first input terminal 201. A drain of the PMOS 208 is connected to a drain and a gate of an NMOS 207, and the output terminal 203. Respective sources of the NMOS 206 and the NMOS 207 are connected to the second power supply terminal V−, and a source of the PMOS 204 is connected to the first power supply terminal V+.

FIG. 7 shows a concrete circuit diagram of the second overcurrent detecting circuit.

In this circuit, a PMOS 304 has a gate connected to a first input terminal 301, and a drain commonly connected to a drain and a gate of an NMOS 305, and a gate of an NMOS 308. A source of the NMOS 305 is connected to a drain of a NMOS 306 and a source of the NMOS 308. A gate of the NMOS 306 is connected to the second input terminal 302. A drain of the NMOS 308 is connected to a drain and a gate of a PMOS 307, and the output terminal 303. Respective sources of the PMOSs 304 and 307 are connected to the first power supply terminal V+, and a source of the NMOS 306 is connected to the second power supply terminal V−.

The operation of the circuit according to the second embodiment will be now described. This circuit operates in the same manner as the circuit of the first embodiment except the first overcurrent detecting circuit 200, the second overcurrent detecting circuit 300, the first current compensation transistor 400 and the second current compensation transistor 500. The operation of the circuit is mainly explained when the offset occurs in the operational amplifier.

The NMOSs 11 and 12, and the PMOSs 14 and 15 of the first differential amplifying stage, the PMOSs 41 and 42 and the NMOSs 44 and 45 of the second differential amplifying stage are designed to have the same channel width and the same channel length to eliminate the occurrence of the offset.

For example, regarding the channel length of both transistors, in the case that the channel length of the NMOS 12 is less than that of the NMOS 11, the dc voltage at the node N1 moves in the direction of the second power supply voltage at its operating point. As a result, the PMOS 21 of the first amplifying stage 20 permits a large current to flow compared with a case where the NMOSs 11 and 12 have the same channel length, so that the voltage at the node N3 moves in the direction of the first power supply voltage at its operation point. The voltage at the node N4 of the first level shifting stage 30 connected thereafter to the first amplifying stage 20 is also moved in the direction of the first power supply voltage at its operating point.

As a result, the NMOS 72 constituting the outputting stage is likely to permit a larger current to flow. To compensate the increment of the current, the second differential amplifying stage, the second amplifying stage and the second level shifting stage where no offset occurs permit the voltage at the node N6 to move in the direction of the second power supply voltage so that the PMOS 71 constituting the outputting stage permits the current to flow, whereby an overcurrent flows through the PMOS 71 and the NMOS 72 constituting the outputting stage interposed between the first and second power supply terminals.

The first overcurrent detecting circuit 200, the second overcurrent detecting circuit 300, the first current compensation transistor 400 and the second current compensation transistor 500 operate to prevent an overcurrent which feeds through the transistors of the outputting stage where the offset occurs. Detailed explanation thereof will be now described.

The first input terminal 201 of the first overcurrent detecting circuit 200 is connected to the node N6 and the second input terminal 202 is connected to the node N4. When the offset does not occur, the voltage between the node N6 and the first power supply terminal is slightly larger than the threshold voltage of the PMOS. Likewise, the voltage between the node N4 and the second power supply terminal is slightly larger than the threshold voltage of NMOS. Accordingly, very small current flows through the PMOS 71 and the NMOS 72 of the outputting stage 70.

The current also flows through the PMOS 204, the PMOS 205, and the NMOS 206 of the first overcurrent detecting circuit 200 which receives signals at the node N6 and node N4. The ratio of the channel width with respect to the channel length of the PMOS 204 is set to be 1/50 to 1/70 compared with that of the PMOS 71, and the ratio of the channel width with respect to the channel length of the NMOS 206 is set to be 1/50 to 1/70 compared with that of the NMOS 72.

Accordingly, the current which flows through the PMOS 204, the PMOS 205, and the NMOS 206 is very small. The PMOS 208 connected to the PMOS 205 by the mirror connection, and very small current flows through the PMOS 208 and NMOS 207 in response to the mirror connection ratio. A voltage which is slightly larger than the threshold voltage of the NMOS is outputted between the output terminal 203 and the second power supply terminal.

Very small current flows through the first current compensation transistor 400 which receives this output voltage. The current value is sufficiently smaller than the current which flows through the PMOS 21 and the NMOS 22 of the first amplifying stage 20, it does not influence the voltage at the node N3.

Likewise, the first input terminal 301 of the second overcurrent detecting circuit 300 is connected to the node N6 and the second input terminal 302 is connected to the node N4. When the offset does not occur, the current flows through the PMOS 304, the NMOS 305, and the NMOS 306 of the second overcurrent detecting circuit 300 which receives the input signals at the node N6 and node N4.

The ratio of the channel width with respect to the channel length of the PMOS 304 is set to be 1/50 to 1/70 compared with that of the PMOS 71, while the ratio of the channel width with respect to the channel length of the NMOS 306 is set to be 1/50 to 1/70 compared with that of the NMOS 72.

Accordingly, the current which flows through the PMOS 304, the NMOS 305 and the NMOS 306 is very small. The NMOS 308 and the NMOS 305 are connected to each other by mirror connection, and very small current flows through the NMOS 308 and the PMOS 307 in response to the mirror connection ratio. A voltage which is slightly larger than the threshold voltage of the PMOS is outputted between the output terminal 303 and the first power supply terminal.

Very small current flows through the second current compensation transistor 500 which receives this output voltage. The current value is sufficiently smaller than that which flows through the NMOS 51 and PMOS 52 of the second amplifying stage 50, it does not influence the voltage at the node N5.

For a signal inputted through the input terminal, when the voltage at the node N6 is oscillated in the direction of the second power supply voltage, the voltage at the node N4 is also oscillated in the second power supply voltage. When the voltage at the node N4 is oscillated in the direction of the first power supply voltage, the voltage at the node N6 is also oscillated in the direction of the first power supply voltage. Since such a complementary operation is performed, there is little change in current which flows through the PMOS 204, the PMOS 205 and the NMOS 206 of the first overcurrent detecting circuit 200 which receives the signals at the node N6 and the node N4.

Likewise, since there is little change in current which flows through the PMOS 304, the NMOS 305 and the NMOS 306 of the second overcurrent detecting circuit 300, it does not influence the input signal.

Described next is a case where the offset occurs. When the offset occurs, the voltage at the node N1 is moved in the direction of the second power supply voltage at its operating point in the case that the channel length of the NMOS 12 can be shorter than that of the NMOS 11 as mentioned above.

As a result, the PMOS 21 of the first amplifying stage 20 permits a larger current to flow compared with a case where the NMOS 11 and the NMOS 12 have the same channel length. Accordingly, the voltage at the node N3 is moved in the direction of the first power supply voltage at its operating point, and the voltage at the node N4 of the first level shifting stage 30 connected thereafter to the first amplifying stage 20 is also moved in the first power supply voltage at its operating point.

Interlocking with this operation, the current flowing through the NMOS 51 of the second amplifying stage 50 increments so as to move the voltage at the node N5 in the direction of the second power supply voltage. At this time, a large current flows through the PMOS 204, the PMOS 205 and the NMOS 206 of the first overcurrent detecting circuit 200 which receives the signals at the node N6 and node N4. A current also flows through the PMOS 208 which is connected to the PMOS 205 by mirror connection and through the NMOS 207 in response to the mirror connection ratio. The voltage between the output terminal 203 and the second power supply terminal becomes larger than the threshold voltage of the NMOS.

Since the first current compensation transistor 400 which receives this output draws a current which compensates the increment of current caused by the offset of the first amplifying stage 20, the voltages at the node N3 and node N4 are returned in the direction of the second power supply voltage so that the current of the NMOS 72 of the outputting stage 70 decrements.

Likewise, a large current flows through the PMOS 304, the NMOS 305 and the NMOS 306 of the second overcurrent detecting circuit 300 which receives voltages at the node N6 and node N4. A current also flows through the NMOS 308 connected to the NMOS 305 by mirror connection and through the PMOS 307 in response to the mirror connection ratio. The voltage between the output terminal 303 and the first power supply terminal becomes larger than the threshold voltage of the PMOS.

Since the second current compensation transistor 500 which receives this output voltage supplies a current which compensates the increments of current caused by the offset of the second amplifying stage 50, the voltages at the node N5 and node N6 are returned in the direction of the first power supply voltage so that the current of the NMOS 71 of the outputting stage 70 decrements.

The second embodiment has the following effects.

a) Since there is provided a circuit for detecting and compensating the overcurrent in the outputting stage caused by the offset in the operational amplifier, the overcurrent failure caused by the variations in transistor characteristics can be sharply decreased.

b) Since the overcurrent detecting circuit is constructed to have the ratio of the channel width with respect to the channel length which is sufficiently smaller than that of the transistors of the outputting stage, it is possible to reduce the increments of the consumption current by the additional circuit.

c) Since the overcurrent detecting circuit is constructed not to respond to the same phase component of the voltage at the gates of the PMOS and NMOS constituting the outputting stage, it does neither influence the regular input signals nor the quality such as signal distortion.

d) Since the overcurrent compensation can be realized by two transistors, the increase of the scale of circuit by the additional circuit can be reduced.

According to the operational amplifier of the invention, the input signals are differentially amplified by the first differential amplifying stage. The output of the first amplifying stage is amplified by the first amplifying stage in opposite phase. Meanwhile, the input signals are differentially amplified by the second differential amplifying stage. The output of the second differential amplifying stage is amplified by the second amplifying stage in opposite phase. If the amplification degree of the first and second amplifying stages is large, the output thereof is oscillated to a voltage approximate to those of the first and second power supply voltages. Further, the output of the first amplifying stage is level shifted by the first level shifting stage in the direction of the first power supply voltage. The output of the second amplifying stage is level shifted by the second level shifting stage in the direction of the second power supply voltage. In such a manner, when the outputs of the first and second amplifying stages approach to the power supply voltage, the levels thereof are shifted to avoid the transistors of the outputting stage from being in the off area. Accordingly, it is possible to supply a large power approximate to the power supply voltage to the load resistance, and hence the change in the consumption current relative to the power supply voltage can be reduced at the signal non-issuance time. Further, symmetrical constructions are formed between the input terminal and the gate of the n-channel transistor of the outputting stage, and between the input terminal and the gate of the p-channel transistor, thereby rendering the distortion of waveforms thereof small.

Although the invention has been explained with reference to typical embodiments, the invention is not limited to those of the embodiments. The various modifications of the typical embodiments and other embodiments of the invention will become more evident with reference to the explanations set forth hereinbefore. Accordingly, the scope of claims is considered to cover all the variations and other embodiments of the invention to include genuine scope thereof.

What is claimed is:

1. An operational amplifier comprising;
 a first differential amplifying stage for differentially amplifying input signals comprising n-channel MOS transistors serving as differential amplifying elements;
 a second differential amplifying stage for differentially amplifying input signals comprising p-channel MOS transistors serving as differential amplifying elements;
 a first amplifying stage for amplifying an output of the first differential amplifying stage in opposite phase;
 a second amplifying stage for amplifying an output of the second differential amplifying stage in opposite phase;
 an outputting stage comprising a p-channel transistor a source of which is connected to a first power supply voltage and an n-channel transistor a source of which is connected to a second power supply voltage for executing complementary operation in response to outputs of the first and second differential amplifying stages;

a first level shifting stage for level shifting an output of the first amplifying stage in the direction of the first power supply voltage to control a gate of the n-channel transistor of the outputting stage; and a second level shifting stage for level shifting an output of the second amplifying stage in the direction of the second power supply voltage to control a gate of the p-channel transistor of the outputting stage.

2. The operational amplifier according to claim 1, wherein respective first and second amplifying stages comprise transistors for amplifying purpose and constant current elements, and wherein the transistor for amplifying purpose of the first differential amplifying stage having substantially the same characteristics as a load transistor of the first differential amplifying stage, and the transistor for amplifying purpose of the second differential amplifying stage having substantially the same characteristics as a load transistor of the second differential amplifying stage.

3. The operational amplifier according to claim 1, wherein output dc voltages of the first and second amplifying stages are set in the manner that the voltages between the sources and drains of transistors constituting the load elements of the first and second amplifying stages are lower than threshold voltages of the same transistors.

4. The operational amplifier according to claim 1, wherein bias voltages of transistors for realizing respective constant current elements of the first differential amplifying stage, the second differential amplifying stage, the first amplifying stage, the second amplifying stage, the first level shifting stage and the second level shifting stage are produced by a bias circuit for receiving a reference power supply voltage.

5. The operational amplifier according to claim 1, wherein the transistors for realizing constant current elements have substantially the same transistor characteristics as those for producing bias voltages by the bias circuit, and these transistors are connected to each other by mirror connection.

6. The operational amplifier according to claim 4, wherein the bias circuit produces a first bias voltage for determining a current which flows through the constant current element constituted by the p-channel transistor and a second bias voltage for determining a current which flows through the constant current element constituted by the n-channel transistor, wherein the first and the second bias voltages are determined by a single p-channel transistor or a single n-channel transistor and a reference power supply voltage.

7. The operational amplifier according to claim 1 further comprising:

a first power-down control transistor provided between the gate of the p-channel transistor of the outputting stage and the first power supply voltage; and a second power-down control transistor provided between the gate of the n-channel transistor of the outputting stage and the second power supply voltage.

8. The operational amplifier according to claim 1 further comprising:

a first phase compensation circuit provided between an output terminal of the outputting stage and an output terminal of the second level shifting stage; and a second phase compensation circuit provided between the output terminal of the outputting stage and the output terminal of the first level shifting stage.

9. The operational amplifier according to claim 1, wherein the first amplifying stage comprises:

a p-channel transistor having a source connected to the first supply voltage and a gate connected to the output terminal of the first differential amplifying stage, and an n-channel transistor having a source connected to the second power supply voltage and a gate connected to a second bias voltage, and a drain connected to a drain of the p-channel transistor, wherein the drain of the p-channel transistor serves as the output terminal.

10. The operational amplifier according to claim 1, wherein the second amplifying stage comprises;

an n-channel transistor having a source connected to the second power supply voltage and a gate connected to the output terminal of the second differential amplifying stage; and a p-channel transistor having a source connected to the first power supply voltage and a gate connected to a first bias voltage, and a drain connected to a drain of the n-channel transistor;

wherein the drain of the n-channel transistor serves as the output terminal.

11. The operational amplifier according to claim 1, wherein the first level shifting stage comprises;

a p-channel transistor having a source connected to the first power supply voltage and a gate connected to a first bias voltage; and an n-channel transistor having a source connected to the output terminal of the first amplifying stage, a gate and a drain commonly connected to each other to form a common node connected to a drain of the p-channel transistor;

wherein the common node of the gate and drain serves as an output terminal.

12. The operational amplifier according to claim 1, wherein the second level shifting stage comprises:

an n-channel transistor having a source connected to the second power supply voltage and a gate connected to a second bias voltage; and a p-channel transistor having a source connected to the output terminal of the second amplifying stage, a gate and a drain commonly connected to each other to form a common node connected to a drain of the n-channel transistor;

wherein the common node of the gate and drain serves as an output terminal.

13. The operational amplifier according to claim 8, wherein the first phase compensation circuit comprises an MOS resistor composed of a p-channel transistor and an n-channel transistor, and a capacitor respectively provided between the second level shifting stage and the output terminal of the outputting stage and serially connected to one another in this order;

and wherein the gate of the p-channel transistor is connected to the second power supply voltage and the gate of the n-channel transistor is connected to the first power supply voltage.

14. The operational amplifier according to claim 8, wherein the second phase compensation circuit comprises an MOS resistor composed of a p-channel transistor and an n-channel transistor, and a capacitor respectively provided between the first level shifting stage and the output terminal of the outputting stage and serially connected to one another in this order;

and wherein the gate of the p-channel transistor is connected to the second power supply voltage and the gate of the n-channel transistor is connected to the first power supply voltage.

15. An operational amplifier comprising first and second differential amplifying means for differentially amplifying input signals, first and second amplifying means for amplifying outputs of the first and second differential amplifying means, first and second level shifting means for level shifting outputs of the first and second amplifying means, and outputting means having a p-channel MOS transistor a source of which is connected to a first power supply voltage, and an n-channel MOS transistor a source of which is connected to a second power supply voltage, said outputting means executing complementary operation in response to outputs of the first and second level shifting means, wherein the operational amplifier further comprises:

first and second overcurrent detecting circuits for detecting outputs of the first and second level shifting means; and first and second current compensation means for compensating increments of current of the first and second amplifying means in response to detected outputs of the first and second overcurrent detecting circuits.

16. The operational amplifier according to claim 15, wherein the first overcurrent detecting circuit includes means for detecting the change in voltage of the first and second level shifting means in opposite phase, and overlaying the amount of change in voltage onto a threshold voltage of the n-channel MOS transistor while the second power supply voltage serves as a reference voltage as the detected output.

17. The operational amplifier according to claim 15, wherein the second overcurrent detecting circuit includes means for detecting the change in voltage of the first and second level shifting means in opposite phase, and overlaying the amount of change in voltage onto a threshold voltage of the p-channel MOS transistor while the first power supply voltage serves as a reference voltage as the detected output.

18. The operational amplifier according to claim 17, wherein the p-channel MOS transistor and the n-channel MOS transistor for detecting the first and second overcurrent have the ratio of channel width with respect to channel length which is sufficiently smaller than that of transistors of the outputting means having a p-channel MOS transistor a source of which is connected to the first power supply voltage and an n-channel MOS transistor a source of which is connected to the second power supply voltage for executing complementary operation in response to outputs of the first and second level shifting means.

19. The operational amplifier according to claims 18, wherein the first current compensation means comprises an n-channel MOS transistor which is disposed in parallel with the n-channel MOS transistor of the first amplifying means.

20. The operational amplifier according to claims 19, wherein the second current compensation means comprises a p-channel MOS transistor which is disposed in parallel with the p-channel MOS transistor of the second amplifying means.

* * * * *